(12) United States Patent
Grasset

(10) Patent No.: US 8,409,928 B2
(45) Date of Patent: Apr. 2, 2013

(54) METHOD FOR MAKING CONTACTLESS PORTABLE OBJECTS

(76) Inventor: Yannick Grasset, Vallauris (FR)

( * ) Notice: Subject to any disclaimer, the term of this patent is extended or adjusted under 35 U.S.C. 154(b) by 0 days.

(21) Appl. No.: 13/063,629

(22) PCT Filed: Sep. 14, 2009

(86) PCT No.: PCT/FR2009/001091
§ 371 (c)(1),
(2), (4) Date: Mar. 14, 2011

(87) PCT Pub. No.: WO2010/029233
PCT Pub. Date: Mar. 18, 2010

(65) Prior Publication Data
US 2011/0171783 A1    Jul. 14, 2011

(30) Foreign Application Priority Data
Sep. 12, 2008  (FR) ..................... 08 05015

(51) Int. Cl.
*H01L 21/00* (2006.01)
(52) U.S. Cl. ........ 438/118; 438/106; 438/119; 438/222; 257/E21.499; 257/E21.505
(58) Field of Classification Search ............... 438/14–18, 438/118; 257/783, E21.499, E21.505
See application file for complete search history.

(56) References Cited

U.S. PATENT DOCUMENTS

| 5,706,015 | A | 1/1998 | Chen et al. |
| 5,765,277 | A * | 6/1998 | Jin et al. ............ 29/743 |
| 5,786,979 | A | 7/1998 | Douglass |
| 6,421,013 | B1 | 7/2002 | Chung |
| 6,700,796 | B2 | 3/2004 | Detcheverry et al. |
| 6,900,536 | B1 | 5/2005 | Derbenwick et al. |
| 7,612,676 | B2 | 11/2009 | Yuen et al. |
| 7,687,327 | B2 | 3/2010 | Cleeves et al. |
| 7,988,059 | B2 | 8/2011 | Grasset |

(Continued)

FOREIGN PATENT DOCUMENTS

| DE | 10133588 A1 | 9/2002 |
| EP | 1742171 A1 | 1/2007 |

(Continued)

OTHER PUBLICATIONS

International Search Report of PCT/FR2009/001091, mailing date Dec. 22, 2009.

(Continued)

*Primary Examiner* — Charles Garber
*Assistant Examiner* — Abdulfattah Mustapha
(74) *Attorney, Agent, or Firm* — Westerman, Hattori, Daniels & Adrian, LLP

(57) ABSTRACT

The invention relates to a method for manufacturing contactless portable objects with an integrated circuit. The method of the invention is characterized in that it comprises the steps of: providing a silicon wafer (1) having integrated circuits (2) comprising plates (7) for connecting said circuits by capacitive coupling to the contact terminals of an antenna conductor circuit (5) provided at the surface of a dielectric substrate (4) of the contactless object; cutting the integrated circuits from said silicon wafer; grasping the integrated circuits using a gripping means of an integrated circuit transfer machine; and transferring the grasped integrated circuits onto the dielectric substrate so that the plates of said circuits are positioned substantially opposite the contact terminals of the antenna circuits. The invention can particularly be used for manufacturing UHF RFID objects.

17 Claims, 2 Drawing Sheets

U.S. PATENT DOCUMENTS

| | | | |
|---|---|---|---|
| 2003/0042572 A1 | 3/2003 | Detcheverry et al. | |
| 2005/0001785 A1 | 1/2005 | Ferguson et al. | |
| 2005/0045914 A1 | 3/2005 | Agranat et al. | |
| 2006/0063323 A1 | 3/2006 | Munn | |
| 2006/0261950 A1 | 11/2006 | Arneson et al. | |
| 2007/0007342 A1 | 1/2007 | Cleeves et al. | |
| 2007/0056683 A1 | 3/2007 | Manes et al. | |
| 2007/0216534 A1 | 9/2007 | Ferguson et al. | |
| 2007/0284759 A1* | 12/2007 | Suguro et al. | 257/783 |
| 2008/0061981 A1 | 3/2008 | Munn | |
| 2008/0129511 A1 | 6/2008 | Yuen et al. | |
| 2009/0014527 A1 | 1/2009 | Grasset et al. | |
| 2009/0278690 A1* | 11/2009 | Degani | 340/572.7 |
| 2011/0139878 A1 | 6/2011 | Grasset | |

FOREIGN PATENT DOCUMENTS

| | | |
|---|---|---|
| FR | 2894714 A1 | 6/2007 |
| WO | 97/024740 A1 | 7/1997 |
| WO | 2006/009934 A1 | 1/2006 |
| WO | 2008/092798 A1 | 8/2008 |
| WO | 2009/010649 A1 | 1/2009 |
| WO | 2009/115673 A2 | 9/2009 |

OTHER PUBLICATIONS

International Search Report of PCT/FR2009/000163 (WO2009/0115673), cited in co-pending U.S. Appl. No. 12/867,405.

* cited by examiner

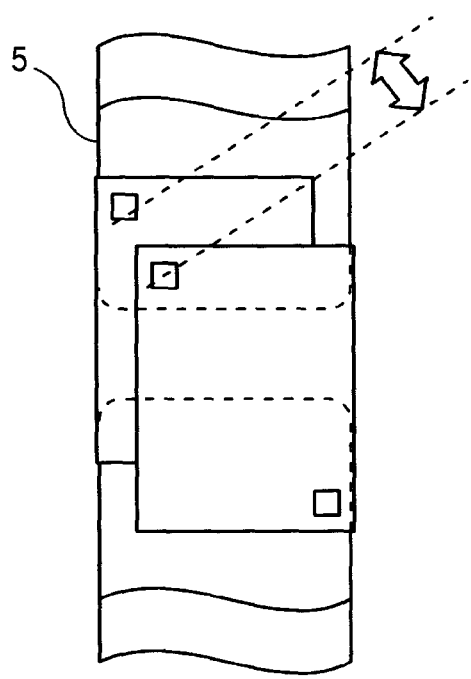
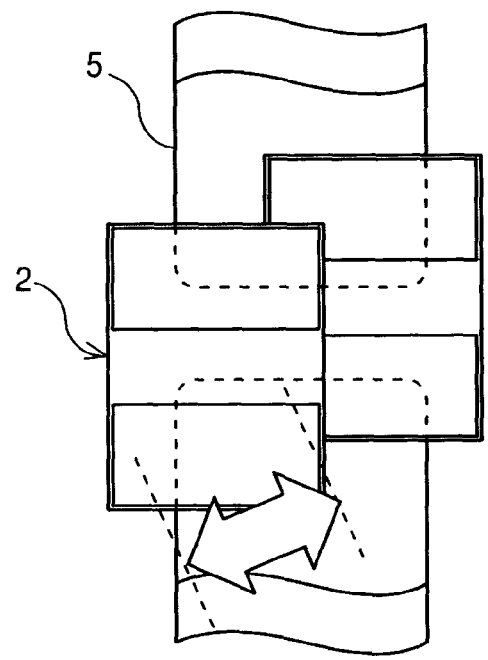
PRIOR ART
FIG. 3A
FIG. 3B

METHOD FOR MAKING CONTACTLESS PORTABLE OBJECTS

The present invention relates to a method for manufacturing contactless portable objects comprising an integrated circuit, and the use of an integrated circuit transfer machine for carrying out such a manufacturing method.

The contactless portable objects described in the present invention are objects in the form of cards, known as smart cards, having a contactless mode of operation, or objects of various formats, particularly intended for radiofrequency identification (RFID), for example, as a replacement for barcodes. The latter objects having various formats are commonly referred to as electronic tags or inlays.

The prior art contactless portable objects comprise, on the one hand, an integrated circuit, and on the other hand, an object substrate provided with an antenna conductor circuit. Terminals of the antenna conductor circuit are connected to the integrated circuit for transmitting and receiving radiofrequency signals between a remote reader and said integrated circuit.

The connection of the integrated circuit's contact pads to the terminals of the antenna conductor circuit may be carried out according to different methods.

Firstly, this connection may be carried out according to the so-called wire-bonding method. In this case, the contact pads of the integrated circuits are connected to the contact terminals of the antenna conductor circuit by means of connection wires, generally made of gold. Two welding operations are then necessary for each connection wire, a first one to the integrated circuit's connection pads, and a second one to the antenna circuit's terminals. Furthermore, a protective resist must be deposited onto the connected integrated circuit to ensure protection of said circuit and said connection wire.

The manufacturing rates of contactless objects according to this first manufacturing method are extremely low, in particular because of the multiple welding steps. Furthermore, the objects thus manufactured are thick because of the presence of the connection wires embedded within the protective resist.

The connection of the contact pads of the integrated circuit to the terminals of the antenna conductor circuit may be carried out according to the so-called "bump bonding" method. In this case, a bump, generally made of gold, is deposited onto the surface of each contact pad of the integrated circuit. The latter is thereafter flipped over ("flip-chip method") so that it can be connected to the terminals of the antenna conductor circuit supported by the object substrate.

The tolerance for the positioning of the integrated circuits on the substrate which carries the conductor circuit according to this method is extremely small. Indeed, in RFID applications, in particular for those RFID applications which operate at ultrahigh frequencies (860-960 MHz), or even in the microwave frequency band (for example at 2.45 GHz), the dimensions of the integrated circuits are small, as is also the case of the contact pads of said circuits and of the bumps which are placed over them. As a result of the foregoing, to ensure the desired optimum yield of 3 sigma, the accuracy required for mounting the integrated circuits must be very high, of the order of a 15 µm deviation with respect to the nominal position. The machines used for achieving such accuracy have relatively small circuit mounting rates. In practice, the nominal rates are of the order of 10,000 units per hour (for example, the rates advertized for the DATACON and MECO™ transfer machine having the reference 8800 FC Smart Line™ or Quantum™, are 10,000 units per hour). This is insufficient, in particular in comparison with the rates obtained for surface mounted circuits (SMCs). The costs for producing the contactless objects manufactured according to the so-called bump-bonding method are thus affected by their relative production slowness.

Of course, there are patent applications that have been filed, in particular in France, of which at least one has so far not yet been published, and another application, which has been published with the number FR2894714, with Mr. Yannick Grasset as the inventor and/or applicant, which disclose new integrated circuits to be transferred onto substrates carrying an antenna conductor circuit for connection to said circuit through capacitive coupling. However, the industrial methods for manufacturing such objects have not been disclosed in these documents, nor have they been developed in practice.

In consideration of the aforementioned prior art, a problem to be solved by the present invention is to provide a method for manufacturing contactless portable objects, which remedies the above-mentioned drawbacks of the existing methods, and which achieves, in particular, high rates of integrated circuit transfer by using machines having high manufacturing rates, for acceptable yields.

A first object proposed by the present invention as a solution to the problem to be solved is to provide a method for manufacturing contactless portable objects with integrated circuits, characterized in that it comprises the steps of:

providing a silicon wafer having integrated circuits including plates for connecting said circuits by capacitive coupling to contact terminals of an antenna conductor circuit provided at the surface of a dielectric substrate of the contactless object;

cutting the integrated circuits from the silicon wafer;

grasping the integrated circuits using a gripping means of an integrated circuit transfer machine; and transferring the grasped integrated circuits onto the dielectric substrate so that the plates of said circuits are positioned substantially opposite the contact terminals of the antenna circuits.

A second object of the present invention is to use a transfer machine having a tolerance for positioning integrated circuits of 30 µm or more, for the manufacture of contactless objects according to the aforementioned method, with a rate of more than 30,000 transfers per hour for a yield of 3 sigma.

Advantageously,—the transfer of integrated circuits onto the dielectric support is performed with a positioning tolerance of 30 µm or more, in particular in the range between 30 and 60 µm;—the transfer of the integrated circuits onto the dielectric substrate is performed at a rate of more than 15,000, or more than 30,000 transfers per hour, for a yield of three sigma;—the transfer machine is a machine intended for the mounting of surface-mounted components;—glue is dispensed between the contact terminals of the antenna circuits prior to the transfer of the integrated circuits, and said integrated circuits are glued to said substrate by means of the dispensed glue;—the integrated circuits are arranged, within the wafer, with their active side facing upwards, and the grasped integrated circuits are flipped over prior to being transferred onto the dielectric substrate, using a gripping means of the transfer machine; and—the integrated circuits are arranged, within the wafer, with their active side facing towards the carrier tape.

The present invention will become more apparent upon reading of the following non-restrictive description, given with reference to the accompanying drawings, in which:

FIGS. 3A and 3B compare the tolerances for positioning integrated circuits according to the method of the present invention with those of the prior art.

Figure 1:
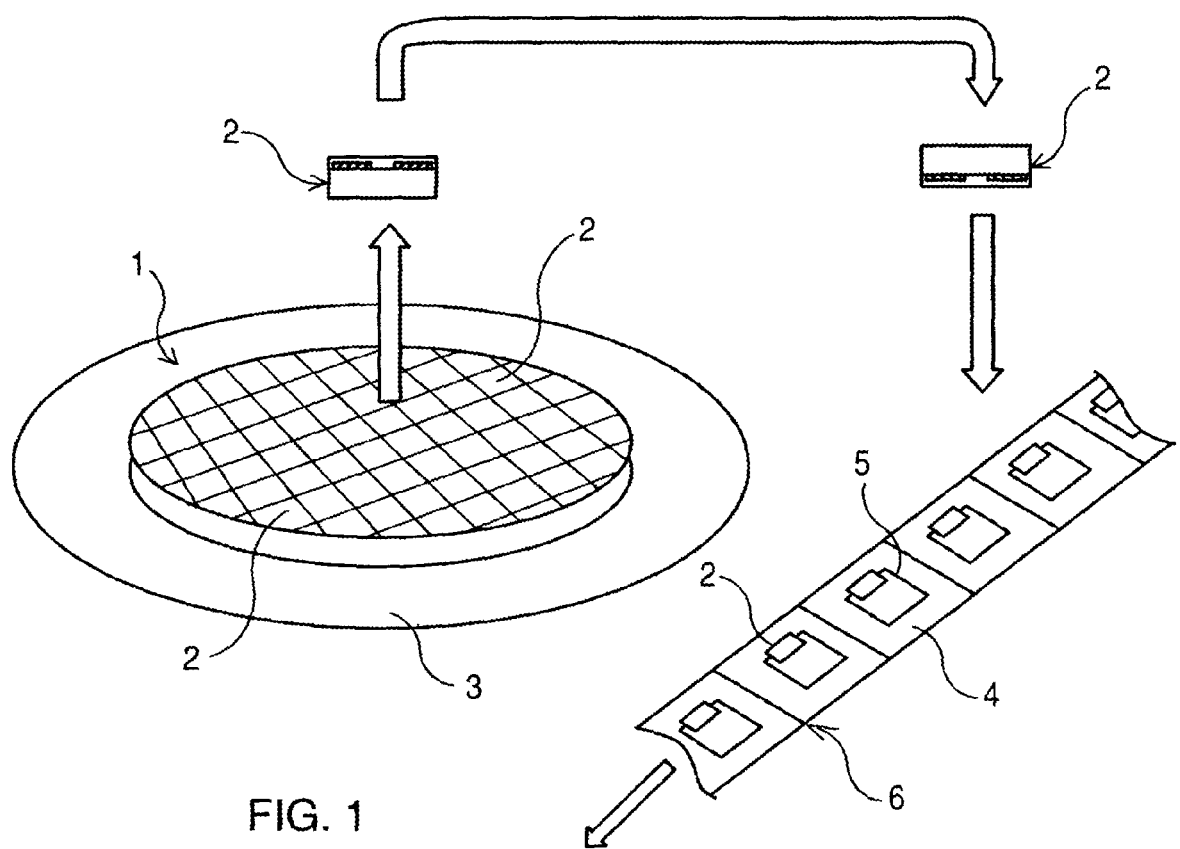
FIG. 1 illustrates an embodiment of the method for manufacturing contactless objects according to the present invention.

The contactless portable objects according to the present invention are standardized objects of any format. For example, these may have a card format, or more restricted formats, in which case they form RFID labels. In some cases, the format of the contactless objects according to the present invention is larger than that of a card. This is the case, for example, of so-called electronic wallets. The RFID objects specifically concerned by the present invention are RFID-UHF objects that comply with the EPC Class 1 Gen II or ISO 18000-6c standards. The operating frequency of said RFID-UFH objects is greater than 400 MHz, in particular 433 MHz, from 800 to 900 MHz, or greater than one GHz.

These portable objects comprise an integrated circuit and an object substrate provided with an antenna conductor circuit.

The integrated circuit or chip is in the form of a parallelepiped having a thickness of approximately one hundred microns, and a width and a length of a few hundred microns, with a so-called active side. It comprises a silicon substrate composed of an overlay of layers comprising integrated circuits that are connected by means of vias.

In a first embodiment, the last metal layer in the integrated circuit according to the present invention, which defines its active side, has contact pads with a limited surface area—for example of the order of 80 µm×80 µm—which is much smaller than the surface area of the integrated circuit's active side. The latter metal layer is coated with a dielectric layer, namely a passivation layer, which, for example, is made of isolating silicon. The passivation layer has openings located opposite the contact pads, in order to allow access to said pads, so that connections can be made to the latter. Furthermore, the integrated circuit includes connection plates. These plates are positioned on the active side of the integrated circuit, at the surface of the passivation layer. They thus form part of this active side and are located within its volume. They are electrically connected to the contact pads of the integrated circuit, through the openings. The sizes of the connection plates are much larger than those of the contact pads, at least as far as the width and length of these plates are concerned. In particular, the surface area of the connection plates is much larger than that of the contact pads. When the integrated circuit has two connection plates, the surface area defined by said plates, which are positioned on the active side of the integrated circuit, is greater than ½ of the surface area of said active side. For example, the surface area of each plate may correspond to approximately ⅓ of the total surface area of the integrated circuit. On the other hand, the thickness of the plates is relatively small, of the order of a few microns, for example 6 µm. The connection plates in turn, are at least partially coated with a dielectric layer, which, similarly to the passivation layer, is made of silicon. With a mean insulating layer thickness of 3 µm for a relative permittivity of 4, and a reference permittivity (in vacuum Epsilon°=8.85 $10^{-12}$ F/m), it is possible to achieve a nominal capacitance of the order of 500 fF to 2.4 pF per connection plate.

In a second embodiment, the connection plates are made on the active side of the integrated circuit, on the last metal layer of the integrated circuit, directly below the passivation layer. Thus, as opposed to the first embodiment, the integrated circuits manufactured according to this second embodiment do not include contact pads connected to the plates, but only contact plates coated with a passivation layer.

The substrate for the contactless object, for example, is a dielectric substrate made of a flexible material. It may then be made of paper, cardboard or plastic. In another example, the substrate is a substrate made of a rigid material. It may then be made of hard plastic or resin.

The antenna circuit defines a track on the object substrate, with its terminal ends forming connection terminals for connection to the integrated circuit's connection plates, by capacitive coupling. This conductor circuit is for example printed onto the substrate's surface, in particular by means of screen-printing, flexography or gravure printing, offset printing or inkjet printing. The conductive ink used is preferably a polymer ink containing conductive elements such as silver, copper or carbon. In another example, the antenna circuit is made of a stamped metal strip laminated to the substrate, or a coiled wire.

The substrate may be a dielectric strap provided with connection terminals, these connection terminals being intended to form a connection between the tracks in a contactless object.

The steps for manufacturing the portable objects according to the present invention are specifically illustrated in FIG. 1.

As may be seen in this figure, to manufacture contactless portable objects according to the present invention, in a first step, a silicon wafer 1 is provided. This silicon wafer 1 comprises a plurality of integrated circuits 2. It rests upon a support tape 3 (or "blue tape") or upon a support tape of the UV type. Generally, this silicon wafer 1 has been subjected to a prior sawing step. Such sawing specifically results in the integrated circuits 2 being separated from one another, such that the latter may be grasped using a gripping means of an adapted circuit transfer machine. Furthermore, wafer 1 has generally been subjected to a prior backgrinding step.

The integrated circuits are positioned in wafer 1 with their active side facing upwards, or facing downwards, that is facing towards the blue tape 3. In the latter case, the blue tape 3 is treated such that the active side of said integrated circuits is not polluted by glue residues.

The defective integrated circuits are marked and/or a wafer-map, which describes the defective circuits, is associated with the silicon wafer. When the integrated circuits are arranged with their active side facing upwards, the marking is then performed on the active side of said integrated circuits and the search for the defective circuits is performed visually or based on the wafer-map. When the integrated circuits are arranged with their active side facing downwards, that is, against the blue tape, the wafer-map is used to discard these circuits from the manufacturing process.

Post-processing of wafers 1 is possible. For example, in the first above-described embodiment for producing integrated circuits, it is possible to use conventional wafers 1 that are provided with integrated circuits having contact pads, and thereafter, deposit a passivation layer in which openings are formed at those locations where the contact pads are provided, and then, during this post-processing, form the connection plates for the connection of the integrated circuits with the antenna conductor circuit, by capacitive coupling, wherein said plates are later coated with an additional dielectric layer.

In another step of the method according to the present invention, the object substrate 4 is used, and is provided with an antenna conductor circuit 5 having terminals which are intended for connection to the contact plates of the integrated circuit 2 by capacitive coupling. In practice, for manufacturing objects according to the present invention, the substrates 4 are provided as strips 6 which will later be cut.

Finally, the transfer machine is provided. This machine has at least one arm or at least one tool provided with a suction cup, said arm and said cup forming a gripping means of the machine. The gripping means makes it possible to grasp an integrated circuit 2 from the wafer 1 of integrated circuits and, if required, to flip over said integrated circuit 2 grasped from the silicon wafer, and then to transfer the grasped, and possibly flipped, integrated circuit onto the object substrate 4.

As may be seen from FIG. 1, the manufacturing method according to the present invention thus comprises a step wherein an integrated circuit 2 is grasped by means of a gripping means of an integrated circuit transfer machine.

When the integrated circuits in the wafer are placed with their active side facing upwards, as is the case in the example shown in FIG. 1, these circuits are then flipped over by means of a gripping means of the transfer machine. In practice, this first gripping means grasps the integrated circuit and rotates the integrated circuit by 180° so that its active side faces downwards.

The integrated circuits that are grasped and possibly flipped over are moved one after the other directly above the antenna substrate. These are then transferred onto the substrate, between the terminals of the antenna conductor circuit.

A drop of a non-conductive glue, for example of the cyanolite or epoxy type, has previously been deposited at this location.

Figure 2:
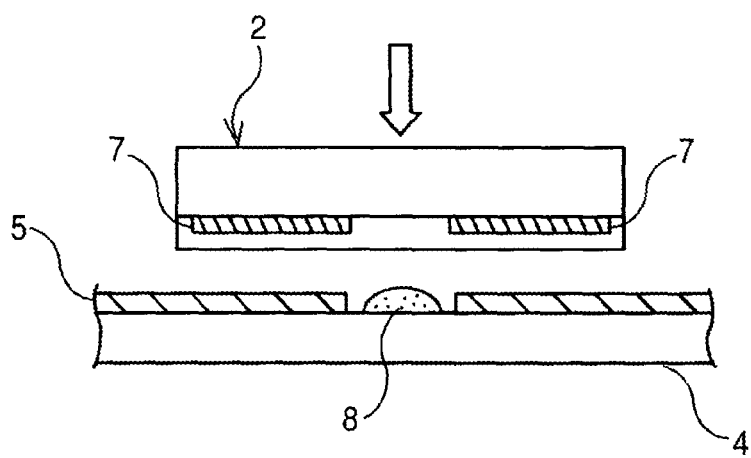
FIG. 2 illustrates diagrammatically the transfer of an integrated circuit onto a substrate which carries an antenna conductor circuit, for the manufacture of a contactless portable object according to the present invention.

The transfer step is diagrammatically shown in more detail in FIG. 2. As may be seen from this figure, for its transfer, the integrated circuit 2, provided with the connection plates 7, is brought vertically above the substrate 4 which carries the antenna 5, with a drop of glue 8 having previously been deposited between the terminals of the antenna 5, for attaching the circuit 2 to the substrate 4. The force exerted upon the circuit 2 and/or the temperature and/or the fluidity of the glue are adjusted so that appropriate attachment of the circuit is ensured. If required, a glue drying or polymerizing step can be carried out later.

The integrated circuits are finally positioned in a flipped chip arrangement such that the last layer, that is, the dielectric layer, is placed opposite the conductor printed on the substrate.

As illustrated in FIG. 3A, when placing the integrated circuits according to the prior art, in which bumps are provided, it is imperative to place the bumps so that they are facing the antenna, with a sufficient margin for a good electric contact, that is, so as to achieve reduced access resistance. In such a case, the mounting accuracy must be of the order of approximately 15 µm for a production yield of 3 sigma. On the other hand, when placing integrated circuits which comprise plates intended for capacitive coupling, it is sufficient, as illustrated in FIG. 3B, to place all or part of the plates forming the connection capacitance in front of the antenna conductor. In this case, the mounting accuracy may lie in the range between 35 and 60 µm.

Thus, the improved mounting tolerances allow production machines for integrated circuit transfer to be used, with production rates that are greater by at least a factor of 10, for example, than that of the machines used according to the prior art. Therefore, according to the present invention, it is possible to use transfer machines which provide positioning tolerances lying in the range between 35 and 60 µm for a production yield of 3 sigma. Such machines are, in particular, machines for mounting SMCs, which allow a 10 fold or greater increase in production rates to be achieved.

A machine which ensures a production rate of 10,000 units per hour under normal operating conditions, which corresponds to the state of the art for stringent mounting tolerances of 10 to 15 µm, as is permitted, for example, by the DATA-CON™ or Test Innovation™ machines, for a period of time of 6,000 hours per year, produces a nominal quantity of 60 million units per year. In comparison, if a SMC mounting machine is used according to the present invention, which would ensure the mounting of 40,000 units per hour under normal operating conditions, for example a Universal™ machine, with mounting tolerances of 35 to 60 µm, for the same period of time of 6,000 hours per year, the produced quantity would be 240 million units. The machines with the highest performance in terms of SMC placement advertize production rates of more that 150,000 placements per hour. This implies that the method according to the present invention has a potential production rate which is multiplied by 15 in comparison with the state of the art machines used in the field of RFID according to the prior art.

With 15,000 transfers per hour, for a yield of 3 sigma, the production rate is already multiplied by 1.5. Fifty percent more units can be manufactured than in the state of the art during the same period of time.

The requirements in terms of production staff being substantially equal and the purchasing costs of these machines being of the same order of magnitude, it may be concluded that the production costs of contactless objects can be highly optimized according to the method of the present invention.

It may further be noted that, in the contactless objects manufactured according to the present invention, the parasitic signals due to mounting variability are reduced.

Indeed, according to the conventional mounting, the positioning spread results in highly varying parasitic signals when the antenna conductor is added above the integrated circuit, without having an accurate position, because of the integrated circuit's size. When a conductor which thus creates a modification in the field lines is present or absent above the integrated circuit's functions (such as, among others, radiofrequency functions, but also oscillators or demodulators . . .), this directly affects the performance of such functions. This may influence both the center frequency of the electronic label operation (such as a spread or even an additional offset in performance, which may be uncontrollable or non-reproducible), and the operating range (because this influences the efficiency of the radiofrequency functions).

According to the present invention, due to the placement of a large-size metal plate onto the integrated circuit, since this plate is identical from one integrated circuit to another, it ensures the constancy and control of the parasitic signals.

In particular, when the plates are added after the integrated circuits have been manufactured, these plates are remote from the rest of the conductors in the integrated circuit, so that the parasitic signals are even further reduced, with respect to the solution whereby the plates constitute the last metal layer of the integrated circuit.

In other words, the parasitic signals are reduced and reproducible.

The invention claimed is:

1. A method for manufacturing contactless portable objects with integrated circuits, comprising the steps of:
providing a silicon wafer having integrated circuits including at least one group of two plates with a large surface area for connecting said integrated circuits by capacitive coupling to contact terminals of an antenna conductor circuit provided at the surface of a dielectric substrate of a contactless object, wherein said connection plates are arranged on an active side of said integrated circuits, and wherein a combined surface area of the plates of the at least one group is greater than one-half of a surface area of said active side of the integrated circuits;
cutting the integrated circuits from the silicon wafer;
grasping the integrated circuits using a gripping means of an integrated circuit transfer machine; and
transferring the grasped integrated circuits onto the dielectric substrate so that the plates of said integrated circuits are positioned substantially facing the contact terminals of the antenna conductor circuit, wherein the transferring of the integrated circuits onto the dielectric substrate is carried out with positioning tolerances of 30 microns or more.

2. The method according to claim 1, wherein the transfer of the integrated circuits onto the dielectric substrate is carried out with a production rate of more than 15,000 transfers per hour, for a yield of three sigma.

3. The method according to claim 2, wherein the transfer of the integrated circuits onto the dielectric substrate is carried out with a production rate of 30,000 transfers per hour, for a yield of three sigma.

4. The method according to claim 1, wherein the transfer machine is a machine for the mounting of surface-mounted components.

5. The method according to claim 1, wherein a glue is dispensed between the contact terminals of the antenna circuits prior to the transfer of the integrated circuits, and in that the integrated circuits are glued to said substrate by means of the dispensed glue.

6. The method according to claim 1, wherein the integrated circuits are arranged in the wafer with their active side facing upwards, and the grasped integrated circuits are flipped over prior to being transferred onto the dielectric substrate, using a gripping means of the transfer machine.

7. The method according to claim 1, wherein the integrated circuits are arranged in the wafer with their active side facing towards a carrier tape.

8. The method according to claim 1, wherein the integrated circuits are provided with contact pads, the surface area of which is much smaller than the surface area of the active side of said circuits, and the surface area of the connection plates is much larger than that of said contact pads.

9. The method according to claim 1, comprising using a transfer machine which provides positioning tolerances for the integrated circuits of 30 µm or more, with a production rate of more than 15,000 transfers per hour for a yield of 3 sigma.

10. The method according to claim 9, wherein the production rate is greater than 30,000 transfers per hour.

11. The method according to claim 9, wherein the positioning tolerances lie in the range between 30 and 60 µm.

12. The method according to claim 9, wherein the transfer machine is intended for the mounting of surface-mounted components.

13. The method according to claim 1, wherein the transfer of the integrated circuits onto the dielectric substrate is carried out with positioning tolerances in the range between 30 and 60 µm.

14. The method according to claim 1, wherein a surface area of each of the plates corresponds to approximately ⅓ of the surface area of said active side of the integrated circuits.

15. The method according to claim 14, wherein the plates are positioned facing the active surface of the integrated circuits, the plates being disposed on opposite sides of a central portion of the active surface, said central portion being uncovered by any of the plates.

16. The method according to claim 1, wherein the plates are positioned facing the active surface of the integrated circuits, the plates being disposed on opposite sides of a central portion of the active surface, said central portion being uncovered by any of the plates.

17. The method according to claim 1, wherein the surface area of one of the plates on the active surface of the integrated circuits is substantially equal to the surface area of the other of the plates on said active surface.

* * * * *